United States Patent [19]

George et al.

[11] Patent Number: 5,475,379
[45] Date of Patent: Dec. 12, 1995

[54] SOLID PHASE CONFORMAL COATING SUITABLE FOR USE WITH ELECTRONIC DEVICES

[75] Inventors: Reed A. George, Lake Worth; Richard L. Mangold, Boynton Beach; Richard K. Brooks, Deerfield Beach, all of Fla.

[73] Assignee: Motorola, Inc., Schaumburg, Ill.

[21] Appl. No.: 405,429

[22] Filed: Mar. 16, 1995

Related U.S. Application Data

[63] Continuation of Ser. No. 42,904, Apr. 5, 1993, abandoned, which is a continuation of Ser. No. 599,945, Oct. 19, 1990, abandoned.

[51] Int. Cl.$^6$ ............................................. H05K 1/00
[52] U.S. Cl. .......................... 340/825.36; 174/52.2; 174/52.3
[58] Field of Search ....................... 340/825.44, 825.47, 340/825.36, 311.1; 455/351; 174/52.2, 52.3, 72 A

[56] References Cited

U.S. PATENT DOCUMENTS

| | | | |
|---|---|---|---|
| 3,866,095 | 2/1975 | Marmorek | 174/52.3 |
| 3,900,241 | 8/1975 | Fry | 174/72 A |
| 4,594,770 | 6/1986 | Butt | 174/52.2 |
| 4,855,868 | 8/1989 | Harding | 174/52.2 |
| 4,894,663 | 1/1990 | Urbish et al. | 455/351 |
| 5,049,874 | 9/1991 | Ishida et al. | 340/825.44 |
| 5,311,403 | 5/1994 | Tanuma et al. | 174/52.2 |
| 5,319,522 | 6/1994 | Mehta | 174/52.2 |
| 5,346,743 | 9/1994 | Uchida et al. | 174/52.2 |
| 5,379,187 | 1/1995 | Lee et al. | 174/52.2 |
| 5,386,342 | 1/1995 | Rostoker | 174/52.2 |

*Primary Examiner*—Donald J. Yusko
*Assistant Examiner*—Edward Merz
*Attorney, Agent, or Firm*—Kelly A. Gardner; Daniel K. Nichols; John H. Moore

[57] ABSTRACT

An electronic device (100) comprises a circuit carrying substrate (300) having an electronic circuit pattern (301) formed thereon, at least one component (302) having leads (304) for electrically coupling the at least one component (302) to the electronic circuit pattern (301) formed on the circuit carrying substrate (300), and a thermoplastic coating (200, 200') for covering the leads (304) of the at least one component (302) to insulate the leads (304) thereof.

16 Claims, 2 Drawing Sheets

SOLID PHASE CONFORMAL COATING SUITABLE FOR USE WITH ELECTRONIC DEVICES

This is a continuation of application Ser. No. 08/042,904 filed on Apr. 5, 1993 which is a continuation of application Ser. No. 07/599,945, filed Oct. 19, 1990, which are now abandoned.

FIELD OF THE INVENTION

This invention relates in general to conformal coatings, and more specifically to solid phase conformal coatings, and is particularly directed toward a solid phase conformal coating suitable for use with electronic devices.

BACKGROUND OF THE INVENTION

Many contemporary electronic devices (e.g., calculators, computers, cameras, televisions, radios, etc.) utilize electrical or electronic circuitry some or all of which may require a protective coating to prevent corruption by contaminants that may impede the proper operation of the electronic device. Typically, such protective coatings at least partially conform to the physical shape of the electrical or electronic devices protected, and thus are commonly referred to in the industry as conformal coatings.

Most commercially available conformal coatings are liquid phase. That is, they are applied in liquid form to the entire substrate either by spraying, brushing, or otherwise dispensing the coating onto the leads of one or more electrical or electronic components (e.g., resistor, capacitor, transistor, integrated circuit, etc.). A predominate problem with liquid phase conformal coatings arises from the fact that typical liquid phase conformal coatings air-cure or cure under exposure to ultra-violet light. That is, mere exposure to air tends to at least partially solidify these conformal coatings. This results in clogged sprayer and dispenser nozzles and contaminated brush applicators, all of which waste material and require such constant maintenance as to make liquid phase conformal coatings impractical in a mass production environment. Regrettably, as impractical as liquid phase conformal coatings are, they remain indispensable to contemporary electronic devices. Accordingly, a very great need exists for an improved conformal coating.

SUMMARY OF THE INVENTION

According to an aspect of the present invention, an electronic device comprises a circuit carrying substrate having an electronic circuit pattern formed thereon, at least one component having leads for electrically coupling the at least one component to the electronic circuit pattern formed on the circuit carrying substrate, and a thermoplastic coating for covering the leads of the at least one component to insulate the leads thereof.

BRIEF DESCRIPTION OF THE DRAWINGS

FIG. 3a is an illustration of the solid phase thermoplastic coating prior to assembly.

FIG. 3b is an illustration of the solid phase thermoplastic coating after assembly.

DESCRIPTION OF A PREFERRED EMBODIMENT

Figure 1:
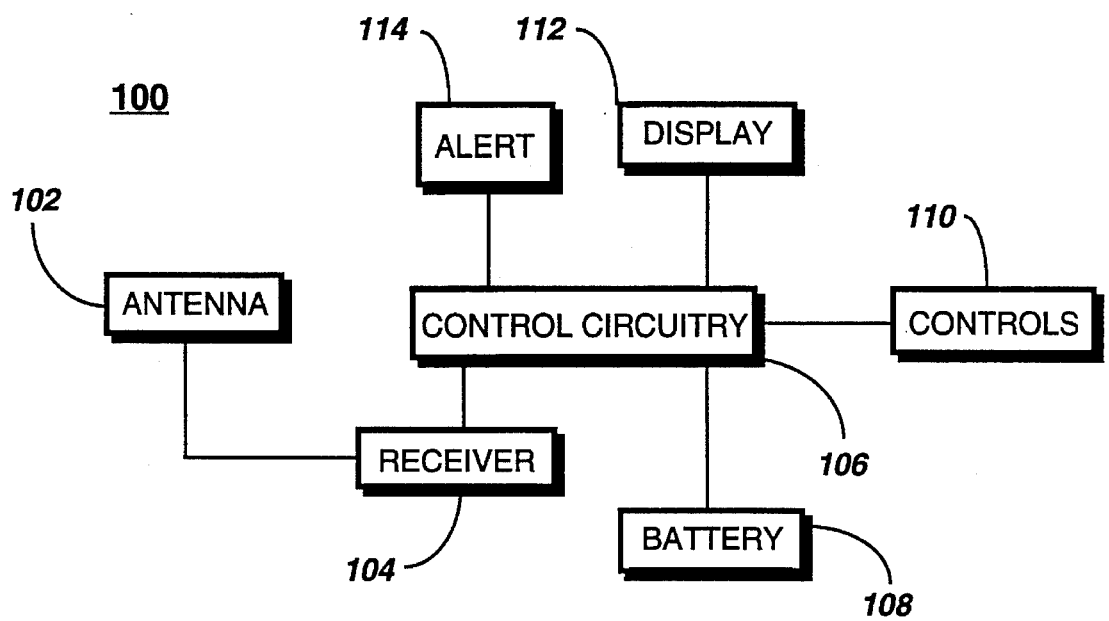
FIG. 1 is a block diagram of a selective call receiver suitable for use with the present invention.

The present invention provides a solid phase thermoplastic conformal coating that may be readily employed in the manufacturing of contemporary electronic devices. As an example, and not as a limitation, FIG. 1 illustrates a battery 108 powered selective call receiver 100 that may advantageously utilize the present invention. As is known, the selective call receiver 100 operates to receive a signal via an antenna 102 that is routed to a receiver 104. The receiver 104 demodulates the received signal using conventional techniques and decodes and recovers information contained within the received signal. In accordance with the recovered information and user operated controls 110, the selective call receiver 100 signals the user via an alert 114 (e.g., audible alert, visual alert, silent or vibrator alert, etc.) that a message has been received. The user may then view the information presented on a display 112 either automatically or by operation of the user controls 100.

The receiver 104, control circuitry 106, and user controls 110 are preferably implemented via electrical and/or electronic circuit components including signal multiplexing integrated circuits, a microcomputer, a digital memory, amplifier circuitry, control interface circuitry, and display illumination circuitry. At least some of these components may require a conformal coating to protect the components from corruption by contaminants.

Figure 2A:
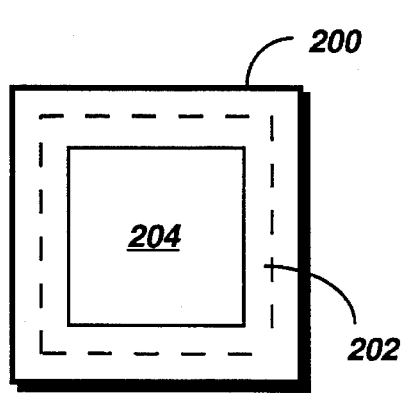
FIGS. 2a–c are illustrations of a solid phase thermoplastic coating in accordance with the present invention.
Figure 2B:
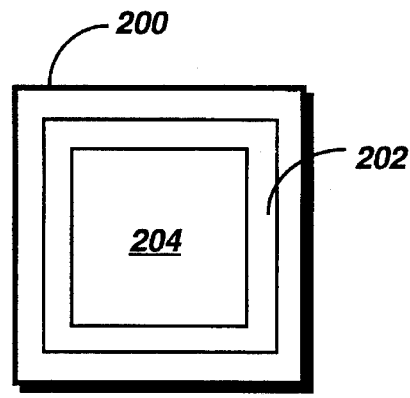
Figure 2C:
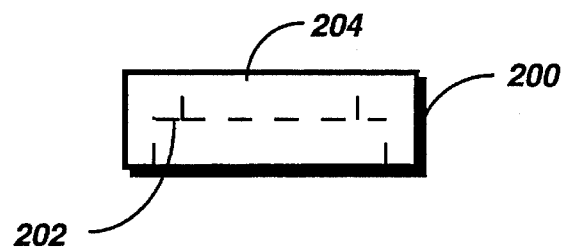

Referring to FIGS. 2a–2c, a preferred conformal coating in accordance with the present invention comprises a thermoplastic material, such as 3702-LM manufactured by 3M and marketed as an adhesive of the hot-melt variety. Of course, any equivalent thermoplastic may be used. In the preferred embodiment, the thermoplastic material is formed via conventional techniques (e.g., molding, routing, etc.) to have a shape substantially corresponding to that of the component to be protected. In FIG. 2a, a top plan view is shown of the thermoplastic material formed into a substantially square shape 200. An optional ridge 202 is preferably provided to rest upon the periphery of the protected component, while an aperture 204 is provided so as not to obscure any identifying indicia on the component. The ridge 202 may be more clearly seen in the bottom plan view of FIG. 2b or side view of FIG. 2c. Of course, the provision of the ridge 202 and the aperture 204 is optional, but are preferred so as to provide the best protection of the component without obscuring the component.

Figure 3C:
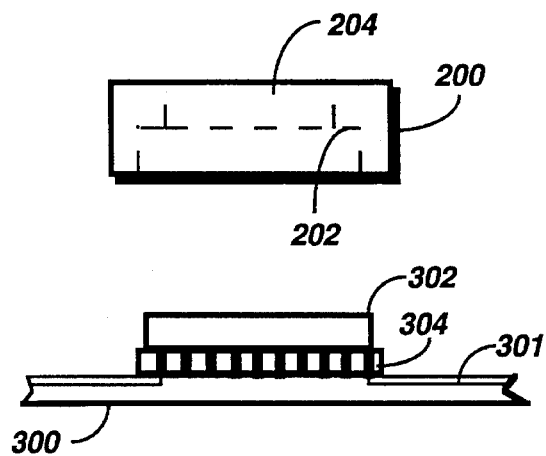
FIGS. 3c and 3d are illustrations of the solid phase thermoplastic coating after heating.
Figure 3C:
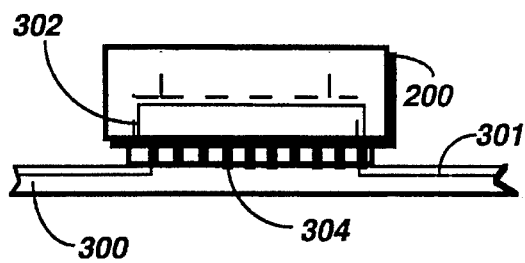
Figure 3C:
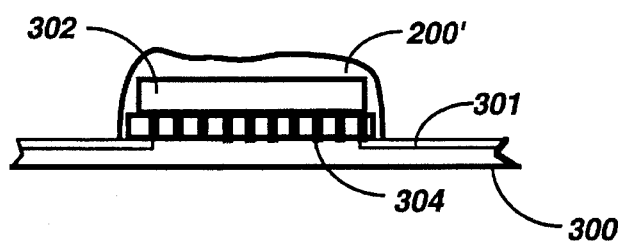

Referring to FIGS. 3a–3d, the use and application of the thermoplastic conformal coating may be seen. In FIG. 3a, a circuit carrying substrate 300 (e.g., printed circuit board, molded circuit board, ceramic substrate, etc.) having an electronic circuit pattern 301 formed thereon has electrical and/or electronic components electrically coupled thereto by any suitable conventional technique, such as by known solder paste reflow practices. For clarity, FIG. 3a illustrates a single integrated circuit 302 that has been soldered to the circuit carrying substrate 300 by preferably applying 9254 solder paste manufactured by DuPont and reflowing in a temperature range of 180° C. to 230° C. Of course, any other solder paste may be used and those skilled in the art will appreciate that the circuitry residing on the circuit carrying substrate 300 may include other components such as resistors, capacitors, and transistors, all of which may benefit from the present invention.

Figure 3D:
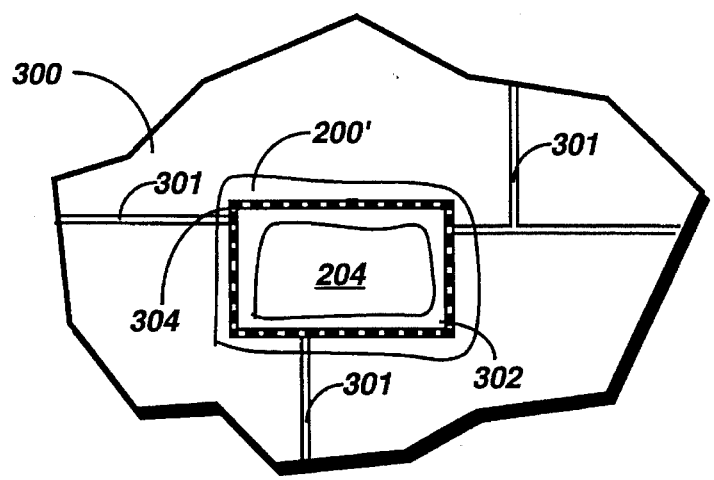

Referring to FIGS. 3a and 3b, the formed thermoplastic conformal coating 200 may be seen as being positionable on the integrated circuit 302 via preferably vertical (i.e., Z-axis) movement. Thus, the present is ideally suited for robotic or other automated assembly techniques to facilitate the manufacturing of electronic devices (e.g., calculators, computers, cameras, televisions, radios, etc.). After being positioned, the thermoplastic conformal coating 200 is heated (either localized to the coating 200 or the entire circuit carrying substrate 300) to a preferred temperature range of 120° C. to 150° C. so as to at least partially liquify (melt) the thermoplastic. This temperature range is selected to be well below the temperature range of the solder paste so as not to again reflow the solder paste. While heated, the thermoplastic tends to flow over the leads 304 of the integrated circuit 302 thus conforming to the general shape of the integrated circuit 302 and its leads 304 as illustrated in FIGS. 3c and 3d. After heating, at least the protected region of the circuit carrying substrate is cooled to allow the thermoplastic to solidify. The leads 304 of the integrated circuit 302 are now protected from the ingress of contaminants by the thermoplastic conformal coating 200'.

An additional benefit over prior conformal coatings is afforded by the present invention in that the solid phase thermoplastic conformal coating facilitates any repair of the electronic device that may be required. That is, unlike other conformal coatings, the thermoplastic conformal coating of the present invention is readily removed by simply reheating the thermoplastic area and scraping it away. Any residue is readily removable using known circuit carrying substrate cleaners and a brush.

In summary, the present invention provides a solid phase thermoplastic conformal coating suitable for use with contemporary electronic devices manufactured in automated mass production environments. The preferred thermoplastic coating is easier to apply during manufacturing and more readily removable for repair than prior conformal coatings.

We claim:

1. An electronic device, comprising:
    a circuit carrying substrate having an electronic circuit pattern formed thereon;
    at least one surface mount component having leads that are electrically coupled to the electronic circuit pattern formed on the circuit carrying substrate during a solder reflow operation; and
    a preformed thermoplastic coating formed into a shape substantially corresponding to that of the at least one surface mount component for fully covering and insulating the leads of the at least one surface mount component without covering or insulating areas of the circuit carrying substrate that are not proximal to the leads of the at least one surface mount component when heat is applied to the preformed thermoplastic coating subsequent to the solder reflow operation.

2. The electronic device of claim 1, wherein the circuit carrying substrate comprises a printed circuit board.

3. The electronic device of claim 1, wherein the circuit carrying substrate comprises a molded circuit board.

4. The electronic device of claim 1, wherein the at least one surface mount component is constructed and arranged upon the circuit carrying substrate to comprise a radio frequency receiver.

5. The electronic device of claim 1, wherein the thermoplastic coating at least partially liquifies in a temperature range of 120° C. to 150° C.

6. The electronic device of claim 1, wherein the at least one surface mount component comprises an integrated circuit die.

7. A selective call receiver, comprising:
    a circuit carrying substrate having an electronic circuit pattern formed thereon;
    receiver circuitry including at least one surface mount component having leads that are electrically coupled to the electronic circuit pattern formed on the circuit carrying substrate during a solder reflow operation; and
    a preformed thermoplastic coating formed into a shape substantially corresponding to that of the at least one surface mount component for fully covering and insulating the leads of the at least one surface mount component without covering or insulating areas of the circuit carrying substrate that are not proximal to the leads of the at least one surface mount component when heat is applied to the preformed thermoplastic coating subsequent to the solder reflow operation.

8. The selective call receiver of claim 7, wherein the circuit carrying substrate comprises a printed circuit board.

9. The selective call receiver of claim 7, wherein the circuit carrying substrate comprises a molded circuit board.

10. The selective call receiver of claim 7, wherein the preformed thermoplastic coating at least partially liquefies in a temperature range of 120° C. to 150° C.

11. The selective call receiver of claim 7, which includes display means, coupled to the receiver circuitry for presenting received messages.

12. The selective call receiver of claim 7, which includes means for indicating receipt of a message.

13. A selective call receiver, comprising:
    a circuit carrying substrate having an electronic circuit pattern formed thereon;
    receiver circuitry for receiving messages, wherein the receiver circuitry includes at least one surface mount component having leads that are electrically coupled to the electronic circuit pattern formed on the circuit carrying substrate during a solder reflow operation;
    a preformed thermoplastic coating formed into a shape substantially corresponding to that of the at least one surface mount component for fully covering and insulating the leads of the at least one surface mount component without covering or insulating areas of the circuit carrying substrate that are not proximal to the leads of the at least one surface mount component when heat is applied to the preformed thermoplastic coating subsequent to the solder reflow operation;
    means for indicating receipt of a message by the receiver circuitry; and
    display means for presenting received messages.

14. The selective call receiver of claim 13, wherein the thermoplastic coating at least partially liquifies in a temperature range of 120° C. to 150° C.

15. A method for assembling a surface mount electrical component to a circuit carrying substrate, the method comprising the steps of:
    soldering leads of the surface mount electrical component to an electronic circuit pattern formed on the circuit carrying substrate, wherein solder between the leads and the electronic circuit pattern is characterized by a first temperature range in which the solder liquefies;
    positioning a preformed thermoplastic coating over the surface mount electrical component, wherein the preformed thermoplastic coating is formed into a shape substantially corresponding to that of the surface mount electrical component, and wherein the preformed thermoplastic coating is characterized by a second, lower temperature range in which the preformed thermoplastic coating liquefies; and heating the circuit carrying substrate to which the surface mount electrical component is soldered to a temperature at which the preformed thermoplastic coating liquefies and coats the leads of the surface mount electrical component without covering areas of the circuit carrying substrate that are not proximal to the surface mount electrical component.

16. The method of claim 15, further comprising the step of:

cooling the circuit carrying substrate so that the preformed thermoplastic coating solidifies into a shape that insulates the leads of the surface mount electrical component without insulating areas of the circuit carrying substrate that are not proximal to the surface mount electrical component.

* * * * *